United States Patent [19]
Adachi

[11] Patent Number: 5,483,471
[45] Date of Patent: Jan. 9, 1996

[54] MICROCOMPUTER

[75] Inventor: Kiyoshi Adachi, Itami, Japan

[73] Assignee: Mitsubishi Denki Kabushiki Kaisha, Tokyo, Japan

[21] Appl. No.: 278,288

[22] Filed: Jul. 21, 1994

[30] Foreign Application Priority Data

Aug. 20, 1993 [JP] Japan .................................. 5-206266

[51] Int. Cl.$^6$ .................................................. G06J 1/00
[52] U.S. Cl. ...................................... 364/602; 365/230.06
[58] Field of Search ........................... 364/602; 395/425; 365/189.01, 230.01, 230.06, 230.08

[56] References Cited

U.S. PATENT DOCUMENTS 5,276,842 1/1994 Sugita ...................................... 395/425

Primary Examiner—Tan V. Mai
Attorney, Agent, or Firm—Lowe, Price, LeBlanc & Becker

[57] ABSTRACT

A microcomputer in which a monitor Read Only Memory (ROM) 100 having a monitor sense amplifier circuit 113 whose normal operation range for power voltage is set narrower than that of the sense amplifier circuit 130 of the ROM 20 is provided, and the sense amplifier circuit 130 of the ROM 20 is constructed so as to has a plurality of sense amplifier circuit portions and a switching circuit portion to obtain an optimum operation range for a plurality of power voltages by switching the circuit characteristic according to a signal supplied from the monitor ROM 100. The sense amplifier circuit 130 is switched to obtain an optimum operation range for a plurality of power voltages, or the frequency of the system clock E can be switched, by detecting such a state wherein the power voltage decreases or the frequency of the system clock E increases to reach near the operation limit.

7 Claims, 16 Drawing Sheets

MICROCOMPUTER

BACKGROUND OF THE INVENTION

1. Field of the Invention

The present invention relates to a microcomputer, particularly to a circuit for reading data from a memory thereof, and specifically to a technology to expand the operation range with respect to the power voltage and to make it possible to prevent the microcomputer from running out of control due to mis-recognition of the data which is read from a memory, by responding to the fluctuation in the system clock frequency, at that time of reading of the data from the internal memory of the microcomputer.

2. Description of the Related Art

A microcomputer of the prior art uses a clock called a system clock in order to smoothly carry out data exchange with built-in ROM and RAM and peripheral circuits, and further with a memory or other devices connected on the outside. Thus all circuits including the circuits provided in the microcomputer make reference to the system clock during input and output of data.

A general configuration of such a conventional microcomputer will be described below with reference to a block diagram of FIG. 1.

In FIG. 1, numeral 8 denotes the main body of a microcomputer.

The microcomputer 8 has a CPU 1, a ROM 2, a RAM 3 and peripheral circuits 4 built therein, which are interconnected by means of an address bus 5 for exchanging address signal ADD and a data bus 6 for exchanging data signal DATA.

Numeral 7 denotes a signal-line (called E signal line hereafter) for the system clock (called E signal hereafter) which is generated by a clock generating circuit 1C located in the CPU 1 and is transmitted to the ROM 2, the RAM 3 and the peripheral circuit 4.

FIG. 2 is a block diagram illustrative of an example of the internal constitution of the ROM 2.

In FIG. 2, numerals 5, 6 and 7 denote the address bus, the data bus and the E signal line described above, respectively.

Numeral 9 denotes an address decoding circuit, numeral 10 denotes a selector circuit, numeral 11 denotes a ROM transistor group, numeral 12 denotes a sense amplifier control circuit, numeral 13 denotes a sense amplifier circuit, numeral 14 denotes a word line which is an output signal line connecting from the address decoding circuit 9 to the ROM transistor group 11, numeral 15 denotes a memory transistor and numeral 16 denotes a bit line which is an output signal line connecting from the ROM transistor group 11 to the selector circuit 10.

The ROM transistor group 11 comprises a plurality of memory transistors 15 arranged in a matrix, each memory transistor 15 being connected to one word line 14 and one bit line 16. This means that one memory transistor 15 is identified by selecting one word line 14 and one bit line 16.

The address decoding circuit 9 selects one word line 14 by decoding an address signal ADD which is supplied from the address bus 5.

At the same time, the result of decoding the address signal ADD by the address decoding circuit 9 is supplied also to the selector circuit 10 which thereby selects one or a plurality of bit lines 16.

The state, namely the content of the memory, of one or a plurality of transistors 15 thus specified by the selection of one word line 14 and one or a plurality of bit lines 16 is identified by the sense amplifier circuit 13, whereby data "1" or "0" is outputted to the data bus 6 depending on the result of identification.

Generally in the manufacturing process of the ROM 2, two types of transistors having different characteristics are made by either carrying out ion implantation or not for one memory transistor 15, while data "1" and "0" are assigned to the respective types, thereby to make a ROM which is a read-only memory with data being stored therein in advance.

Operation of the ROM 2 provided in the microcomputer 8 in case of outputting data with reference to the E signal including the progress with time will now be described below with reference to a timing chart shown in FIG. 3.

The operation of outputting data of the ROM 2 provided in the microcomputer 8 will be referred to simply as "read-out of ROM data" in the description that follows.

In FIG. 3, symbol E denotes the E signal, ADD denotes the address signal given to the ROM 2, and DATA denotes the data signal which is read from the ROM 2.

When the E signal level becomes Vcc level which is the power voltage (called "H" level hereafter), the CPU 1 outputs the address signal ADD specifying the memory transistor 15 where the data to be read from the ROM 2 is stored, from the CPU I to the address bus 5. At this time, while the address signal ADD has an indefinite period (a period when the signal value is not established) t1 temporarily, the address decoding circuit 9 in the ROM 2 selects a word line 14 from among the ROM transistor group 11 in a period t2 that follows, thereby to select a group of memory transistors 15 which are connected to the selected word line 14.

At the same time, the selector circuit 10 specifies one bit line 16 thereby to select a set of memory transistors 15 which corresponds to the number of data bits required by the CPU 1 at a time, for example, from among the group of memory transistors which has been selected by means of the word line 14, as described above.

All these operations are carried out in a period when the E signal is at "H" level.

The series of the above operations is called the preparatory operation for data read-out.

Then after the E signal has returned to the GND level (called "L" level hereafter), the sense amplifier circuit 13 of the ROM 2 starts operation to identify, within a period t3, the state, "1" or "0", of each of the set of memory transistors 15 which have been selected, and accordingly outputs data signal "1" or "0" as the DATA to the data bus 6.

It is obvious from the above description, that read-out of data becomes impossible when the period of "L" level of the E signal is shorter than the period t3.

The series of operations described above is called the data read-out operation.

Although the above description assumes that the preparatory operation for data read-out and the data read-out operation are carried out according to the state of the E signal, "H" level or "L" level, for the sake of simplicity, read-out operation carried out immediately upon completion of the preparatory operation for data read-out is regarded as an equivalent operation, provided that a series of operations is completed within one cycle period of the E signal.

Now the operation of the sense amplifier circuit 13 shown in FIG. 2 will be described.

The sense amplifier circuit 13 identifies, via the bit line 16, the state of each memory transistor 15 which constitutes the ROM transistor group 11 of the ROM 2. A circuit diagram of FIG. 4 shows the specific constitution of the sense amplifier circuit 13.

In FIG. 4, symbols P1, P2 denote P channel transistors (called Pch-Tr hereafter) and N1, N2 denote N channel transistors (called Nch-Tr hereafter).

A source terminal of the Pch-Tr P1 is connected to Vcc which is the power voltage, a gate terminal thereof is connected to GND which is the ground potential and a drain terminal thereof is connected to a drain terminal of the Nch-Tr N1 and to a gate terminal of the Nch-Tr N2.

A source terminal of the Nch-Tr N1 is connected to GND, and a gate terminal thereof is connected to a source terminal of the Nch-Tr N2 and to the bit line 16 via the selector circuit 10.

A drain terminal of the Nch-Tr N2 is connected to a drain terminal of the Pch-Tr P2 and to an input terminal of an inverter INV1.

A source terminal of the Pch-Tr P2 is connected to Vcc and to GND, and a gate terminal thereof is connected to GND.

In the sense amplifier circuit 13 shown in FIG. 4, information of the bit line 16 corresponding to the state of the memory transistor, namely voltage VB, is inputted to the gate terminal of the Nch-Tr N1 and to the source terminal of the Nch-Tr N2. The input voltage VB causes the conductance of the Nch-Tr N1 to change, and accordingly the bias voltage VX which is applied to the Nch-Tr N2 is also changed.

The bias voltage VX can be determined as the intersection of a load curve IN1 of the Nch-Tr N1 with respect to the bias voltage VX and a load curve IP2 of the Pch-Tr P1 shown in a graph of FIG. 5.

Now the graph of FIG. 5 will be described below.

VTHP and VTHN are threshold voltages of the Pch-Tr and the Nch-Tr, respectively. βP1 and βN1 are coefficients representing the current driving capabilities of the Pch-Tr and the Nch-Tr, respectively.

(1) Characteristic of Pch-Tr P1

When inequality Vcc−VX<Vcc−|VTHP| holds, then VTHP<0 and hence $$IP1=\beta P1[(Vcc+VTHP)*(Vcc-VX)-(Vcc-VX)^2/2].$$

When inequality Vcc−VX≧Vcc−|VTHP| holds, then VTHP<0 and hence $$IP1=\beta P1(Vcc+VTHP)^2/2.$$

(2) Characteristic of Nch-Tr N1

When inequality VX<VB−VTHN holds, then $$IN1=\beta N1[(VB-VTHN)*VX-VX^2/2\,]$$

When inequality VX≧VB−VTHN holds, then $$IN1=\beta N1(VB-VTHN)^2/2.$$

Values of βP1 and βN1 are uniquely determined by the channel length and the channel width of the transistor, and can be obtained from the following equation:

$$\beta P1,\ \beta N1=(\mu e/\epsilon ox/tox)*(Wc/ls)$$

where μe: mobility

ϵox: dielectric constant of oxide film tox: thickness of oxide film

Wc: channel width ls: channel length

FIG. 5 also shows a load curve of the Nch-Tr N1 when the voltage VB is at its maximum level and a load curve of the Nch-Tr N1 when the voltage VB is at its minimum level, as IN1B and IN1S, respectively.

It is obvious from the above description, that the bias voltage VX changes with the bit line voltage VB. That is, the bias voltage VX takes its minimum value VXL when the voltage VB reaches the maximum level, and takes its maximum value VXH when the voltage VB reaches the minimum level.

On the hand, voltage V0 at the input terminal of the inverter INV1 can be approximately determined as follows from the conductance GmN2 of the Nch-Tr N2 and the conductance GmP2 of the Pch-Tr P2.

$$V0=GmN2/(GmP2+GmN2)*(Vcc-VB)$$

Taking the fact that GmN2 is controlled by the bias voltage VX and that GmP2 is constant because the gate voltage is constant (GND) into consideration, it can be seen that the voltage V0 changes in accordance to the change in GmN2, namely to the change in the bias voltage VX. This means that conductance GmN2 of the Nch-Tr N2 has the minimum value and the voltage V0 has the maximum value when the bias voltage VX takes its minimum value VXL. And conductance GmN2 of the Nch-Tr N2 has the maximum value and the voltage V0 has the minimum value when the bias voltage VX takes its maximum value VXH. Consequently, when the threshold of the inverter INV1 is set at an intermediate level between the maximum and the minimum values of the voltage V0, it is made possible to read data "1" or "0" by means of the sense amplifier circuit 13 shown in FIG. 4.

Now the operation rate of the sense amplifier 13 will be briefly described below.

While change in the voltage at each point with time is neglected in the above description of operation of the sense amplifier circuit 13 shown in FIG. 4 for the sake of simplicity of description, every junction has parasitic load capacitance which results in a definite period of time taken before the voltage reaches the calculated level. The voltage which takes the longest time to reach the specified level because the point has the highest load capacity among these voltages is the gate voltage of the Nch-Tr N1, namely the voltage VB, which involves the load capacity of the bit line 16 added thereto.

It will be easily expected from the above description of the operation of the sense amplifier 13, that, a longer time taken before the voltage VB reaches the specified level results in a lower rate of the data read-out operation. Therefore, read-out rate varies depending on the capacity of the bit line 16, provided the sense amplifier circuit 13 having the same circuit constitution and the same circuit constant is used. This means that higher load capacity of the bit line 16 results in lower reading rate.

Recently there are microcomputers wherein a plurality of clocks having different frequencies can be used as the system clock. Also there are microcomputers wherein a plurality of voltages can be used as the power voltage. Further, in a microcomputer using a battery as the power source, there is a possibility of the power voltage to fluctuate.

However, in the conventional microcomputer as described above, normal read-out and transmission of the ROM data become impossible when the clock frequency increases to such an extent that the period during which the system clock (E signal) is at "L" level is shorter than the data read-out period t3. It has not been possible to know such a limitation of the read-out of ROM data beforehand in the prior art.

Also it has not been possible to know that the read-out operation margin is near its limitation due to a power voltage drop resulting in a lower rate of read-out from the ROM or a lower rate of data transmission to the data bus, or due to an increased clock frequency, namely that it has become impossible to read data within a specified clock cycle.

This means that a microcomputer using a battery as the power source fails to operate or malfunctions when the power voltage drops below to a certain level as the battery runs out.

Moreover, the range between the minimum level VXL and the maximum level VXH of the bias voltage VX becomes very narrow when the power voltage is low. In such a case, it is possible to increase the range between the minimum level VXL and the maximum level VXH of the bias voltage VX by increasing the values of β of the Pch-Tr P1 and β of the Nch-Tr N1. However, when the circuit constant of the sense amplifier circuit is set so that the range becomes optimum when the power voltage Vcc is low, 3 V, for example, the power voltage Vcc being at the normal level, 5 V, for example, causes the currents IP1 and IN1 to increase and accordingly the power current to increase too, thereby making it difficult to obtain stable operation of the sense amplifier circuit when the process parameters, for example, VTHP and VTHN fluctuate.

Meanwhile, microcomputer makers produce microcomputers which operate on various power voltages according to the users' purposes, or manufacture microcomputers having system clocks of different frequencies. When it is desired to maintain an operation margin for various microcomputers having a wide range of operating power voltages or system clocks of various frequencies, it has been very difficult to set an optimum circuit constant which is appropriate for a wide range of power voltages by using one kind of sense amplifier circuit. Therefore, when designing microcomputers, it is necessary to design sense amplifier circuits having different characteristics corresponding to different, power voltages or to system clocks of different frequencies.

SUMMARY OF THE INVENTION

The present invention has been made to solve the problems described above, and has an object of providing a microcomputer which is, when the power voltage drops or the system clock frequency increases near to the operation limit, capable of detecting it and switching between a plurality of sense amplifier circuits of different circuit constants so that an optimum operation range which is appropriate for the power voltage can be secured, or capable of switching tile system clock frequency.

Thus it is another object of the invention to provide a microcomputer which can respond to a process of designing microcomputers operating on different power voltages or system clocks of different frequencies with only one kind of sense amplifier circuit.

Although the above description deals with ROM as an example of memory, it needs not to say that the same problems as described above exist also for RAM.

A first invention of the microcomputer of the present invention has such a constitution that is provided with a monitor memory having a monitor sense amplifier circuit wherein the range of power voltage for normal operation is set narrower than that of a sense amplifier circuit of the primary memory, and a plurality of sense amplifier circuit portions and a switching circuit portion for the selection thereof to change the circuit characteristic of the sense amplifier circuit of the primary memory according to a signal supplied by the monitor memory so that an optimum operation range is secured for a plurality of power voltages.

A second invention has such a constitution that is provided with a monitor memory having a monitor sense amplifier circuit wherein the normal operation range for the system clock is set narrower than that of a sense amplifier circuit of the primary memory, and a control circuit which changes the system clock frequency, thereby to change the frequency of the system clock according to a signal supplied from the monitor memory so that an optimum operation range is secured for a plurality of system clock frequencies.

A third invention combines the constitution of the first invention and the constitution of the second invention described above.

In the first invention of the microcomputer of this invention, when the power voltage drops to such an extent that the limit of the operation of reading data from the memory is nearly reached, it is detected in advance to switch the characteristic of the sense amplifier circuit, thereby expanding the normal operation range to prevent erroneous data read-out.

In the second invention, when the system clock frequency increases to such an extent that the limit of the operation margin of data read-out from the memory is nearly reached, it is detected in advance to decrease the system clock frequency and thereby securing the margin for the operation of data read-out so as to prevent erroneous data read-out.

Further in the third invention, when the power voltage drops to such an extent that the limit of the operation of reading data from the memory is nearly reached, it is detected in advance to switch the characteristic of the sense amplifier circuit, thereby expanding the normal operation range to prevent erroneous data read-out and, when the system clock frequency increases to such an extent that the limit of the operation of reading data from the memory is nearly reached, it is detected in advance to decrease the system clock frequency thereby securing the margin for the operation of data read-out so as to prevent erroneous data reading.

The above and further objects and features of the invention will more fully be apparent from the following detailed description with accompanying drawings.

DESCRIPTION OF THE PREFERRED EMBODIMENTS

Now the invention will be described in detail below with reference to the drawings illustrative of the preferred embodiments.

Although the description that follows deals with ROM as an example of a memory, it needs not to say that the invention may be applied to a RAM.

Figure 6:
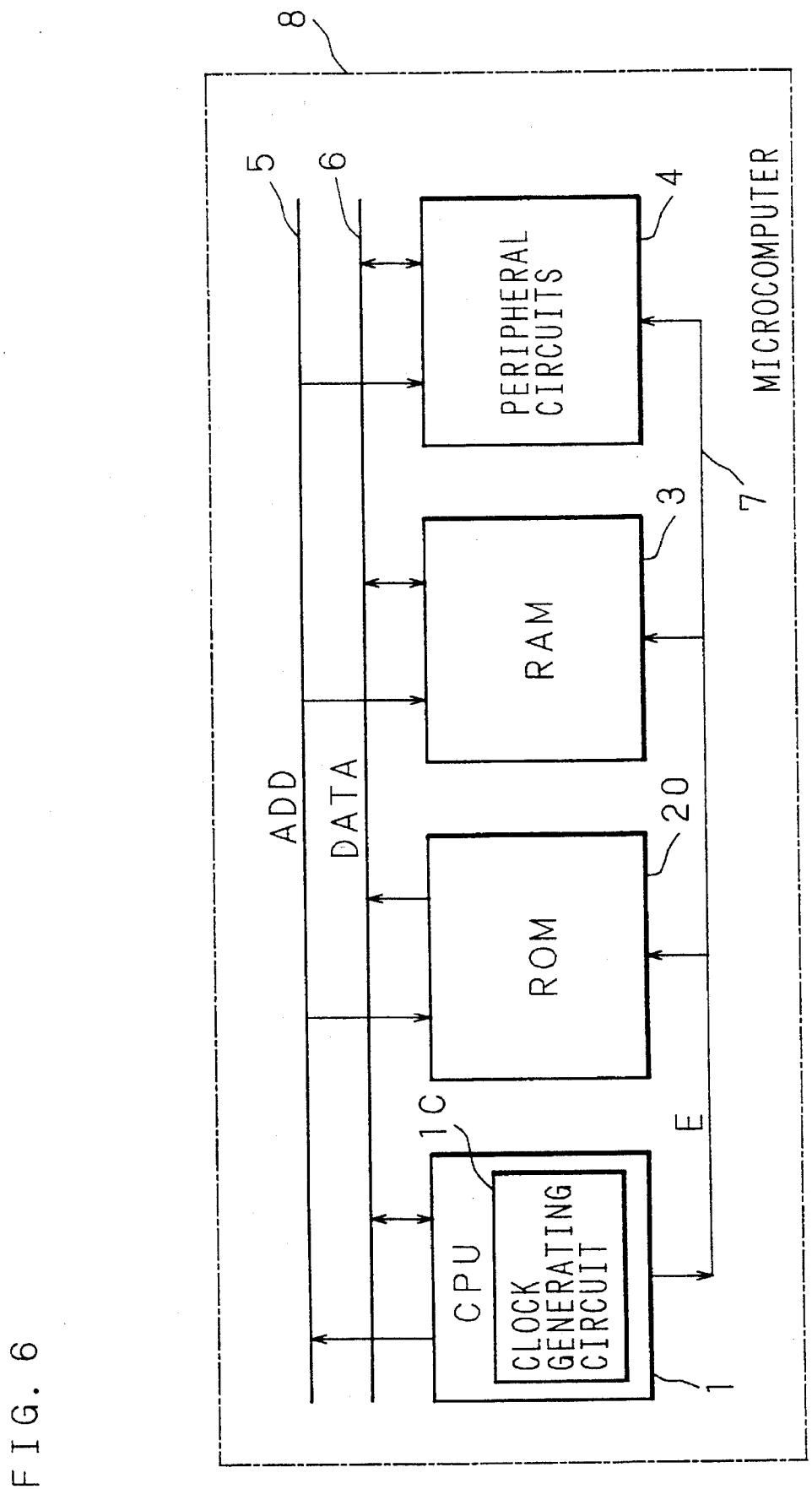
FIG. 6 is a block diagram illustrative of a constitution example of an embodiment of a first invention of a microcomputer of the invention.
Figure 7:
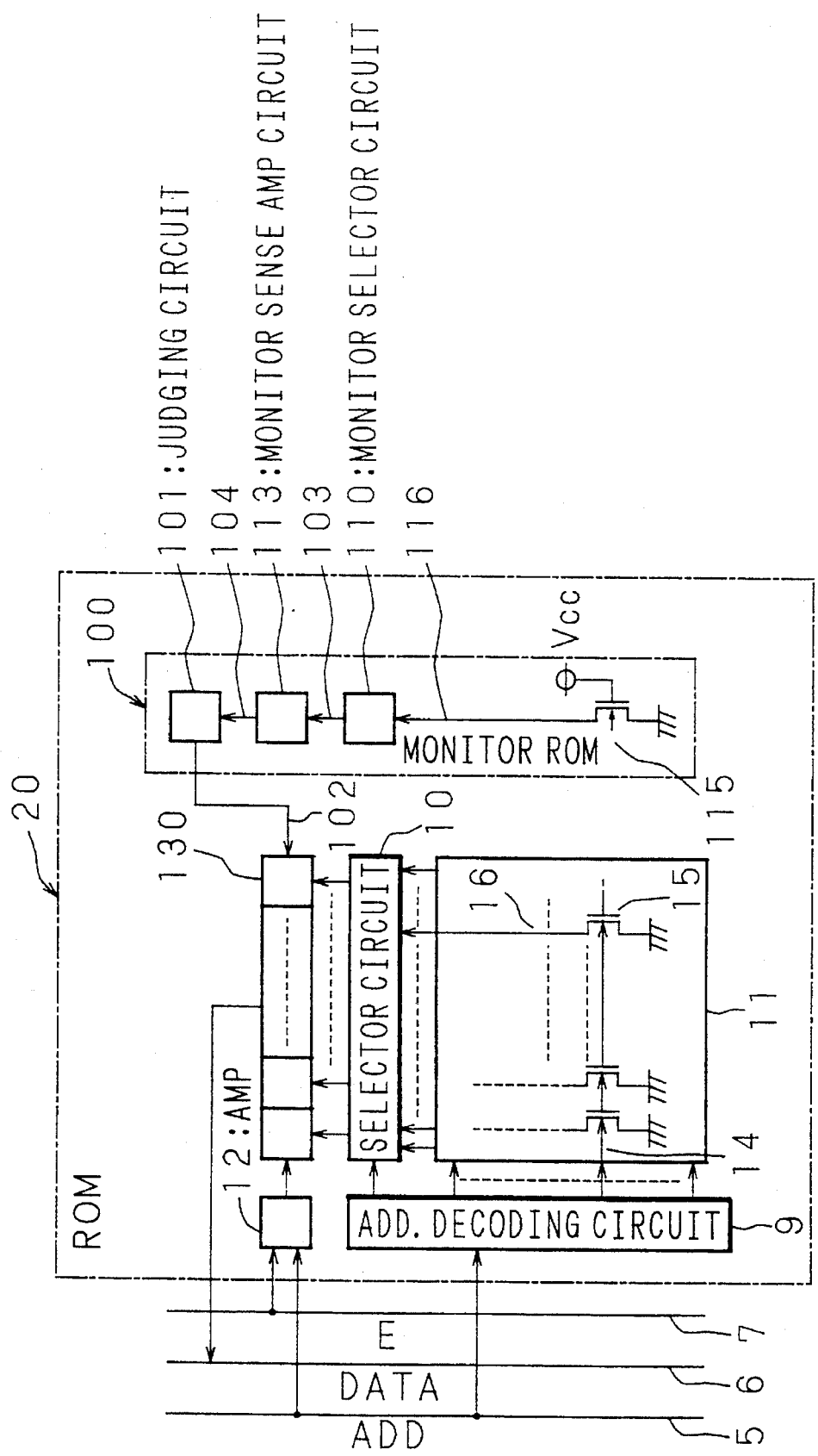
FIG. 7 is a block diagram illustrative of a detailed constitution example of the ROM of the first invention of the microcomputer of the invention.

FIG. 6 is a block diagram illustrative of a constitution example of an embodiment of the first invention of the microcomputer of the invention. FIG. 7 is a block diagram illustrative of a detailed constitution example of the ROM.

Figure 1:
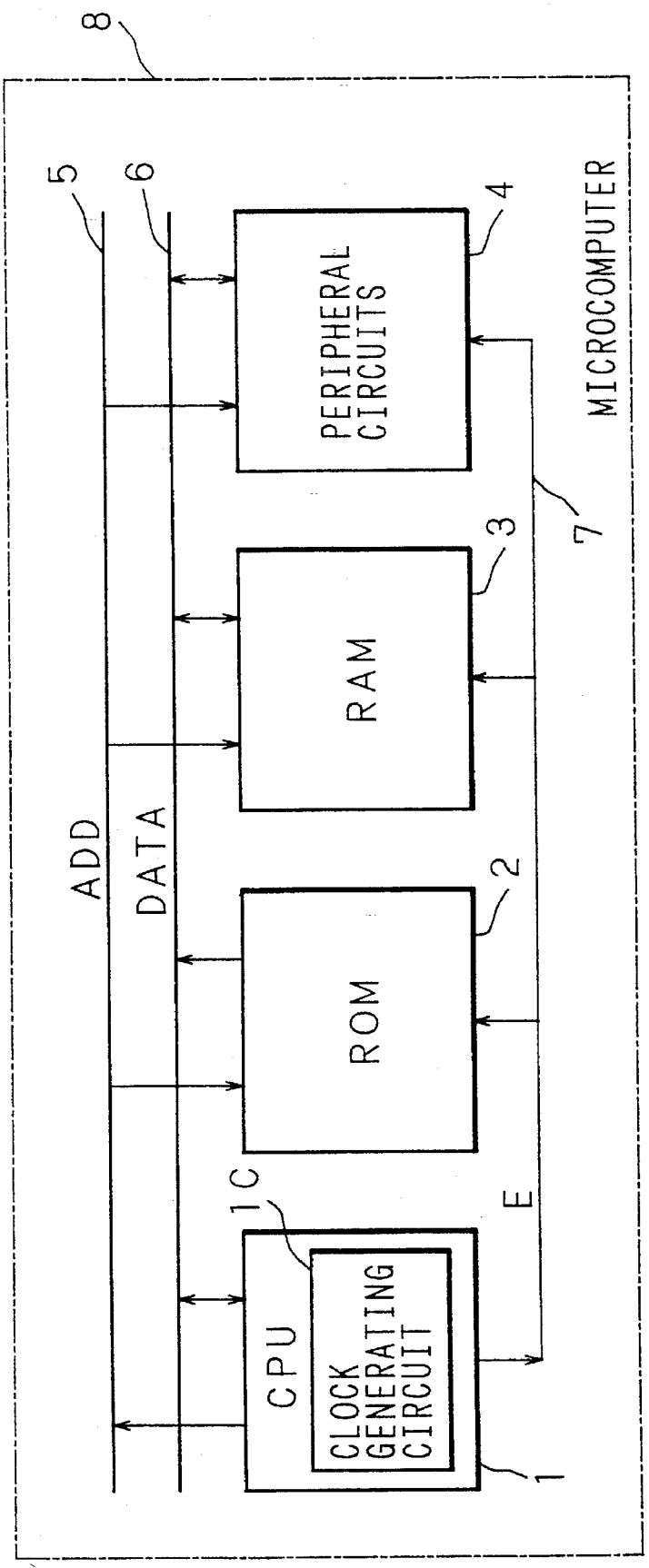
FIG. 1 is a block diagram illustrative of a general constitution of a conventional microcomputer.

Although it needs not to say that the ROM shown in FIG. 7 can be applied to a conventional microcomputer shown in FIG. 1 described as the prior art., it will be indicated by a numeral 20 here as shown in FIG. 6.

In FIG. 6, the constitution is same as that of the conventional microcomputer shown in FIG. 1, except for the ROM 20.

Figure 2:
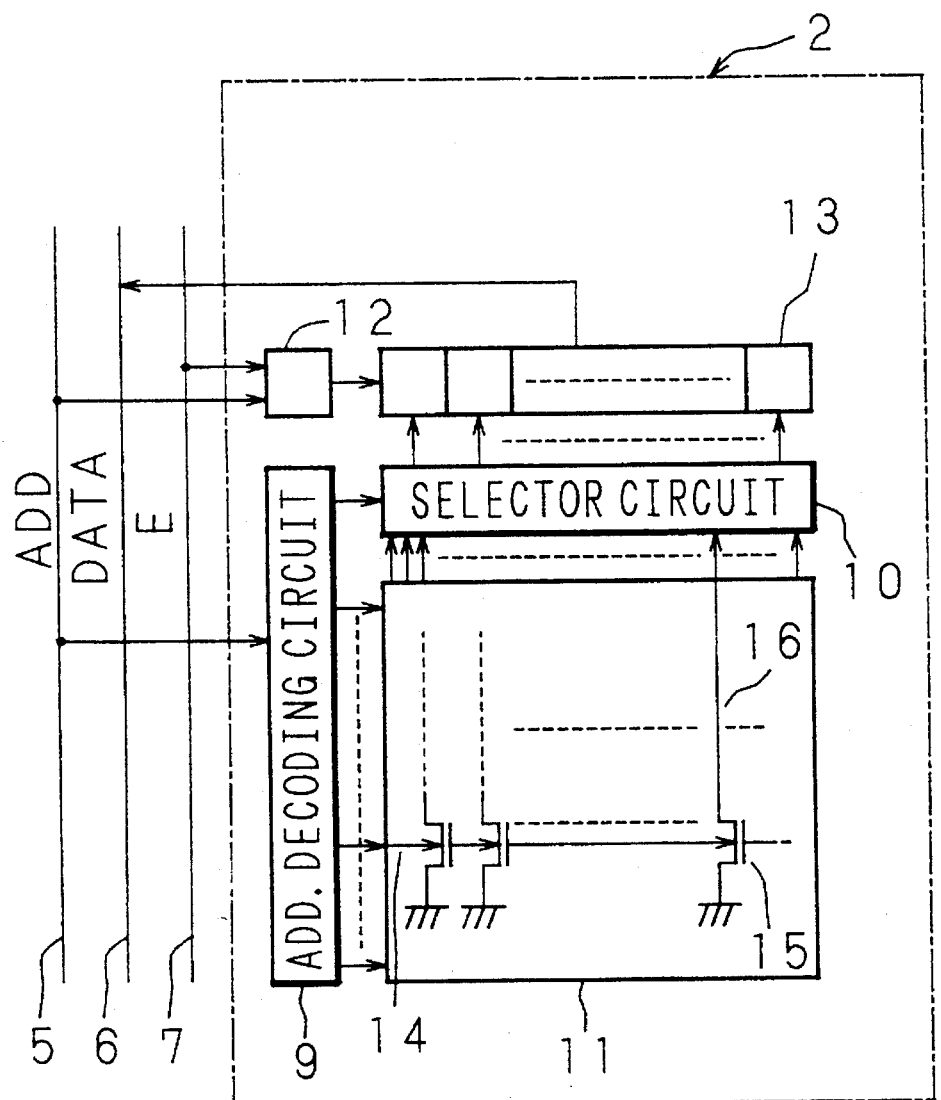
FIG. 2 is a block diagram illustrative of an example for an internal constitution of the ROM of the conventional microcomputer.

In FIG. 7, numerals and symbols identical with those used in FIG. 2 referred to in the description of the prior art denote the same or equivalent portions.

In FIG. 7, numerals 5, 6 and 7 denote an address bus, data bus and E signal line shown in FIG. 6, respectively.

Numeral 9 denotes an address decoding circuit, 10 denotes a selector circuit, 11 denotes a ROM transistor group, 12 denotes a sense amplifier control circuit, 130 denotes a sense amplifier circuit, 14 denotes a word line which is an output signal line connecting from the address decoding circuit 9 to the ROM transistor group 11, 15 denotes a memory transistor, and 16 denotes a bit line which is an output signal line connecting from the ROM transistor group 11 to the selector circuit 10.

The ROM transistor group 11 comprises a plurality of memory transistors 15 arranged in a matrix, with each memory transistor 15 being connected to one word line 14 and to one bit line 16. This means that one memory transistor 15 is identified by selecting one word line 14 and one bit line 16.

The address decoding circuit 9 decodes an address signal ADD which is inputted from the address bus 5 thereby to select one word line 14.

At the same time, result of decoding of the address signal ADD by the address decoding circuit 9 is supplied also to the selector circuit 10 which selects one or a plurality of bit lines 16.

State, namely the stored content, of the one or plurality of memory transistors 15 identified by selecting one word line 14 and one or plurality of bit lines 16 is identified by the sense amplifier circuit 130, and accordingly data "1" or "0" is outputted to the data bus 6 responsive to the result of identification.

Numeral 100 denotes a monitor ROM which characterizes the first invention of the microcomputer of the invention and is provided with a monitor memory transistor 115, a monitor selector circuit 110, a monitor sense amplifier circuit 113 and a judging circuit 101.

The monitor memory transistor 115 has a characteristic equivalent to that of the memory transistors 15 which constitute the ROM transistor group 11, with the drain terminal being connected to GND, the gate terminal being connected to the power voltage Vcc, and the source terminal being connected to the monitor selector circuit 110 via a monitor bit line 116 which has the same characteristic as the bit line 16.

The monitor selector circuit 110 has a characteristic equivalent to that of the selector circuit 10 and is made in such a constitution as always selects the monitor bit line 116.

Consequently, the monitor memory transistor 115 is always capable of reading the state thereof regardless of the address signal ADD, unlike the memory transistors 15 which constitute the ROM transistor group 11. That is, the monitor memory transistor 115 does not need preparatory operation for data read-out.

The monitor selector circuit 110 is connected to the monitor sense amplifier circuit 113 via the signal line 103.

Output signal from the monitor sense amplifier circuit 113 is inputted to the judging circuit 101 via the signal line 104. A switching signal which is outputted from the judging circuit 101 is inputted to the sense amplifier circuit 130 via the signal line 102, while the detail will be described later.

Figure 8:
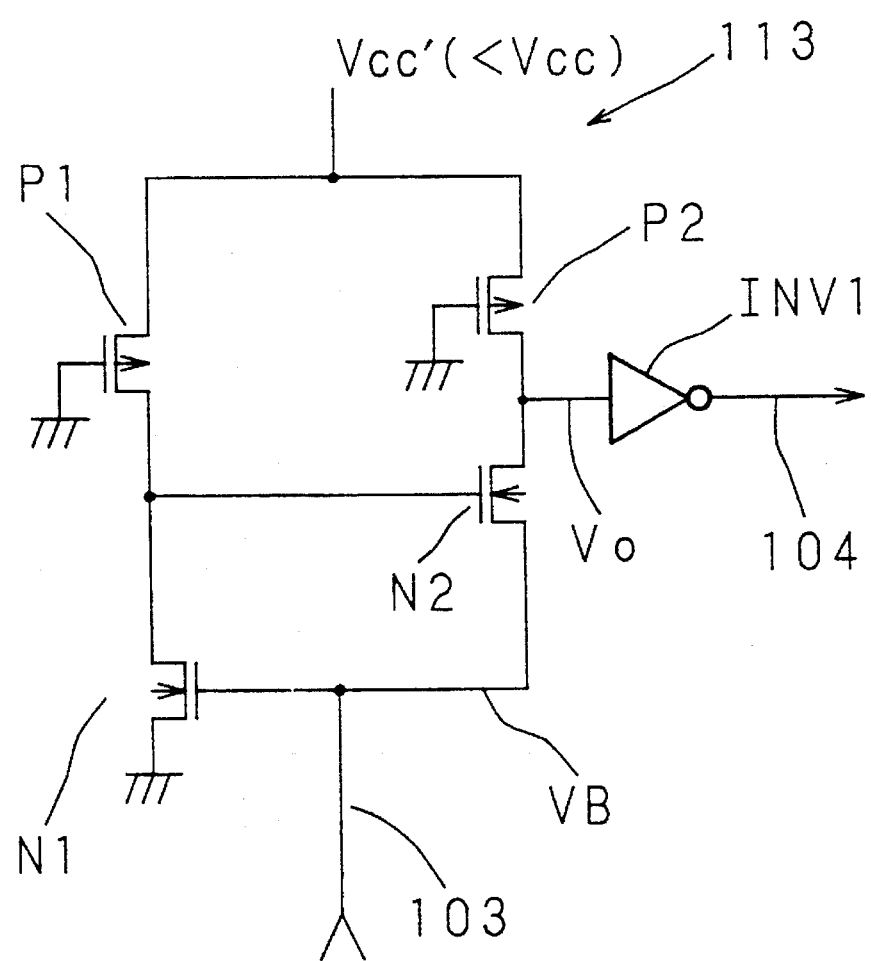
FIG. 8 is a circuit diagram illustrative of the constitution of a monitor sense amplifier circuit of the first invention of the microcomputer of the invention.

The monitor sense amplifier circuit 113 is constituted as shown in the circuit diagram of FIG. 8.

Figure 4:
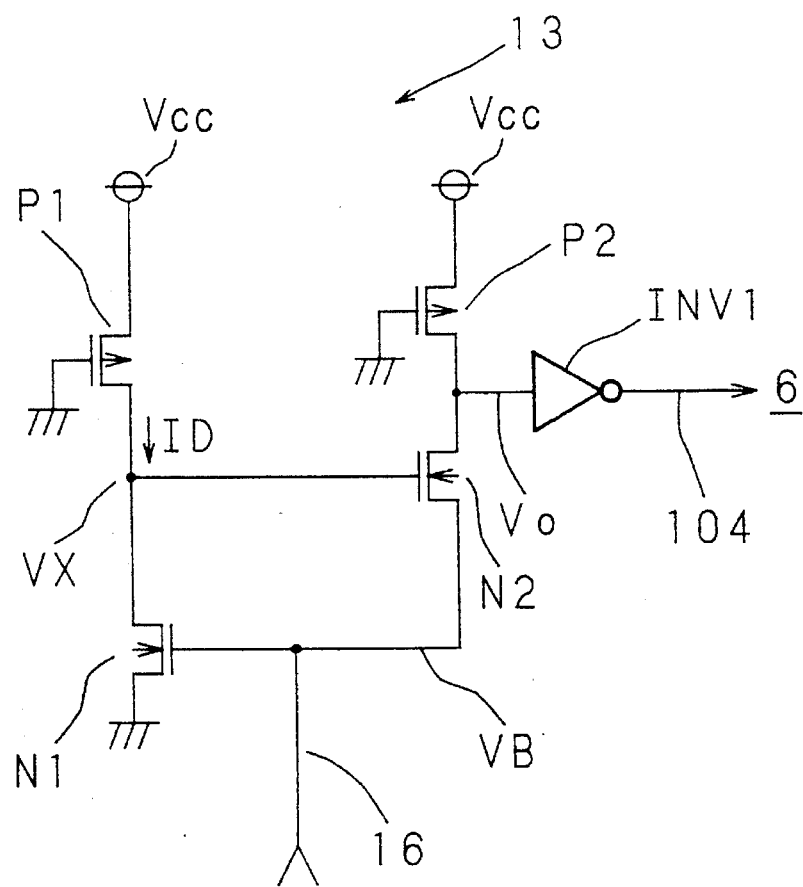
FIG. 4 is a block diagram illustrative of the constitution of the sense amplifier circuit of the conventional microcomputer.
Figure 5:
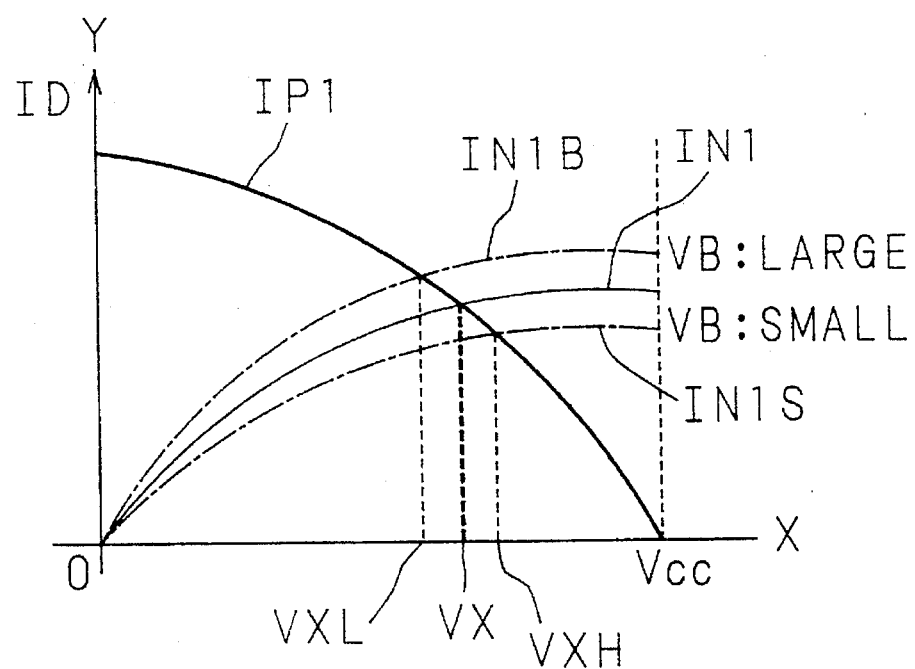
FIG. 5 is a graph showing a relationship between a load curve of an N channel transistor and a load curve of a P channel transistor with respect to the bias voltage of the sense amplifier circuit.

Difference between the monitor sense amplifier circuit 113 shown in FIG. 8 and the conventional sense amplifier circuit 13 shown in FIG. 4 is as follows. While the power voltage Vcc is applied to the source terminals of the Pch-Trs P1, P2 of the conventional sense amplifier circuit 13 shown in FIG. 4, a voltage Vcc' lower than the power voltage Vcc is applied to the source terminals of the Pch-Trs P1, P2 of the monitor sense amplifier circuit 113 shown in FIG. 8.

In such a monitor sense amplifier circuit 113 as shown in FIG. 8, normal read-out operation range on the low voltage side of the power voltage Vcc is set, narrower than in the case of an ordinary sense amplifier circuit, namely the conventional sense amplifier circuit 13. That is, minimum operating power voltage is higher than in case of the ordinary sense amplifier circuit.

Consequently, when the power voltage Vcc lowers to a certain level, the monitor sense amplifier circuit 113 reads data of a value different from an expected value K1 from the monitor transistor 115 in spite of the sense amplifier circuit 13 being operating normally. Output from the monitor sense amplifier circuit 113 is inputted to the judging circuit 101 via the signal line 104.

Figure 9:
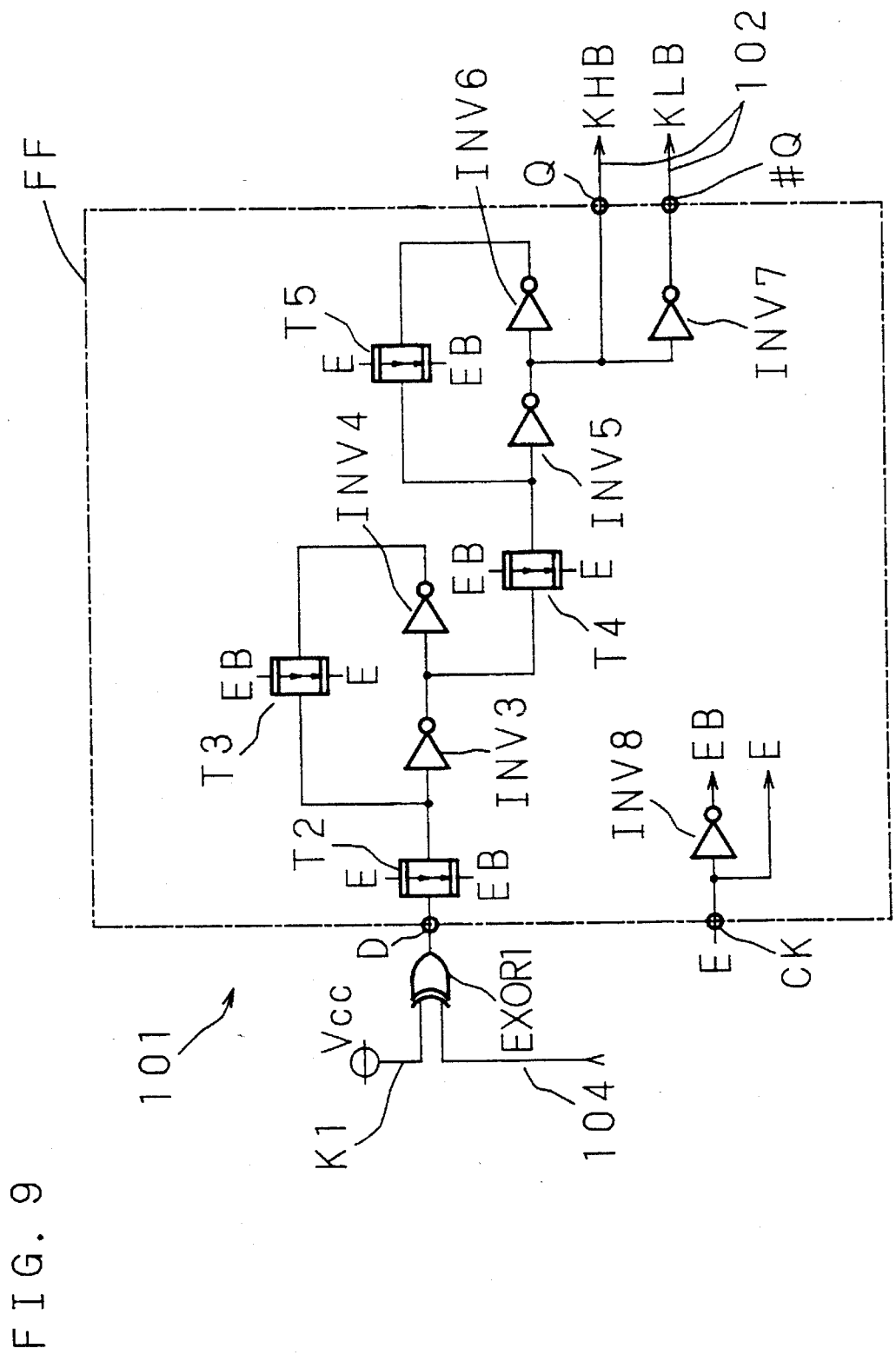
FIG. 9 is a circuit diagram illustrative of the constitution of a judging circuit of the first invention of the microcomputer of the invention.

The judging circuit 101 is constituted as shown in the circuit diagram of FIG. 9.

The judging circuit 101 shown in FIG. 9 mainly comprises an exclusive OR gate EXOR1 and a flip-flop FF.

In FIG. 9, the 2-input exclusive OR gate EXOR1 receives output signal from the monitor sense amplifier circuit 113 via the signal line 104 and a signal of expected value K1 (power voltage Vcc equivalent to "1" in this case) from the monitor memory transistor 115 as inputs thereto. The exclusive OR gate EXOR1 delivers an output signal of "H" level only when the values of the inputs to both input terminals are different from each other.

Output signal from the exclusive OR gate EXOR1 is inputted to a D input terminal of the flip-flop FF, and the E signal is inputted to a CK input terminal of the flip-flop FF. An output signal KHB from a Q output terminal of the flip-flop FF and an output signal KLB from a #Q output terminal are sent to the sense amplifier circuit 130 via the signal line 102.

The flip-flop FF has a general constitution, and T2 through T5 are all transmission gates. The transmission gates T2, T5 are in the conductive state when the E signal is at "L" level, and are in non-conducive state when the E signal is at "H" level. The transmission gates T3, T4 are in non-conductive state when the E signal is at "L" level, and in the conductive state when the E signal is at "H" level.

INV3 through INV7 are inverters.

The E signal supplied from the CK input terminal is inputted intact, or as EB signal inverted by the inverter INV8, to serve as a control signal of the transmission gate.

As the final output signals from the flip-flop FF, positive-logic output signal KHB is outputted from the Q output terminal and negative-logic output signal KLB obtained by inverting the positive-logic output signal KHB in the inverter INV7 is outputted from the #Q output terminal.

The flip-flop FF holds the input signal to the D input, terminal at the time when the E signal turns from "L" level to "H" level (rising edge), namely the level of the output signal from the exclusive OR gate EXOR1, as the level of the output signal (KHB) from the Q output terminal, and holds the inverted value thereof as the level of the output signal (KLB) from the #Q output terminal.

Therefore, in the case where the monitor sense amplifier circuit 113 reads data of a value different from the expected value K1 from the monitor memory transistor 115, the signal is sent to the judging circuit 101 via the signal line 104, thereby its state is detected by the judging circuit 101 so that the output, signal KHB from the Q output terminal of the flip-flop FF is brought to "L" level and the output signal KLB from the #Q output terminal is brought to "H" level.

In such a constitution, when the judging circuit 101 judges that the operation limit of the power voltage is nearly reached, a switching signal is outputted via the signal line 102 to the sense amplifier circuit 130 even when the sense amplifier circuit 130 is making normal read-out operation from the ROM transistor group 11.

Now specific constitution and operation of the sense amplifier circuit 130 will be described below with reference to the circuit diagram of FIG. 10 which shows an example of constitution.

Figure 10:
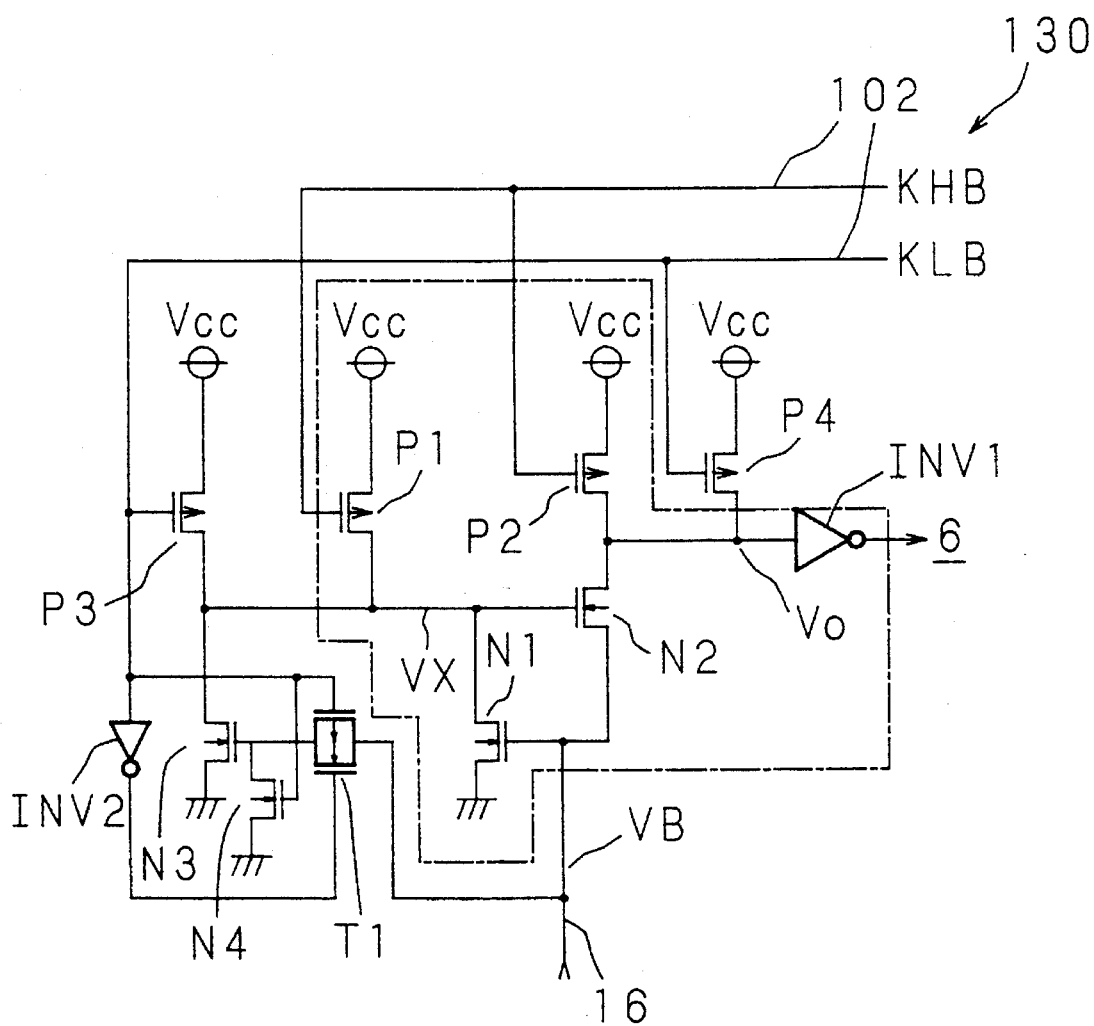
FIG. 10 is a circuit diagram illustrative of the constitution of the sense amplifier circuit of the first invention of the microcomputer of the invention.

The sense amplifier circuit 130 shown in FIG. 10 has a function of changing of the operating voltage range, unlike the conventional sense amplifier circuit 13 shown in FIG. 1 described previously.

In FIG. 10, symbols P1, P2, P3, P4 denote Pch-Tr, N1, N2, N3, N4 denote Nch-Tr, T1 denotes a transmission gate, and INV1, INV2 denote inverters.

In FIG. 10, numerals and symbols identical with those in FIG. 4 referred to in the description of the conventional sense amplifier circuit 13 denote the same or equivalent portions.

Source terminals of the Pch-Trs P1, P2, P3, P4 all have the power voltage Vcc applied thereto. Gate terminals of the Pch-Trs P1, P2 receive the signal KHB, and gate terminals of the Pch-Trs P3, P4 receive the signal KLB, both via the signal line 102.

Drain terminals of the Pch-Trs P1, P3 are connected to the gate terminal of the Nch-Tr N2, to the drain terminal of the Nch-Tr N1 and to the drain terminal of the Nch-Tr N3. Drain terminals of the Pch-Trs P2, P4 are connected to the drain terminal of the Nch-Tr N2, and the input terminal of the inverter INV1.

Gate terminal of the Nch-Tr N3 and the drain terminal of the Nch-Tr N4 are connected to the bit line 16 via the transmission gate T1, while the source terminals thereof are connected to GND.

The gate terminal of the Nch-Tr N4 receives signal KLB given thereto.

Both gate terminals of the transmission gate T1 receive the signal KLB and a signal obtained by inverting KLB in the inverter INV2, respectively.

The source terminal of the Nch-Tr N2 and the gate terminal of the Nch-Tr N1 receive the bit line 16 connected thereto.

Source terminal of the Nch-Tr N1 is connected to GND.

The portion enclosed by alternating dot and dash line in FIG. 10 is a circuit which is basically same as the constitution of the conventional sense amplifier circuit 13 shown in FIG. 4.

As will be obvious from comparison of FIG. 10 and FIG. 4 with each other, the Pch-Trs P1, P2 and the Nch-Tr N4 turn ON, and the Pch-Trs P3, P4, Nch-Tr N3 and the transmission gate T1 all turn OFF when the signal KHB is at "L" level and the signal KLB is at "H" level. Thus the circuit shown in FIG. 10 functions as a sense amplifier circuit having the same characteristic as that of the circuit shown in FIG. 4.

When the signal KHB is at "H" level and the signal KLB is at "L" level, on the other hand, the Pch-Trs P1, P2 and the Nch-Tr N4 turn OFF, the Pch-Trs P3, P4, and the transmission gate T1 turn ON, and the Nch-Tr N3 is enabled to operate. Therefore, in this case, the sense amplifier circuit constituted from the Pch-Trs P3, P4 and the Nch-Tr N3 is put into operation instead of the conventional sense amplifier circuit 13 constituted from the Pch-Trs P1, P2 and the Nch-Trs N1, N2. The sense amplifier circuit constituted from the Pch-Trs P3, P4 and the Nch-Tr N3 is made to have circuit constants different from those of the conventional sense amplifier circuit, 13 constituted from the Pch-Trs P1, P2 and the Nch-Trs N1, N2, through the selection of the transistors.

As described above, the sense amplifier circuit 130 is capable of switching between two sense amplifier circuit portions which have different circuit constants and constitute it, on the basis of the mutually complement signals KHB and KLB given from the judging circuit 101 via the signal line 102.

Figure 11:
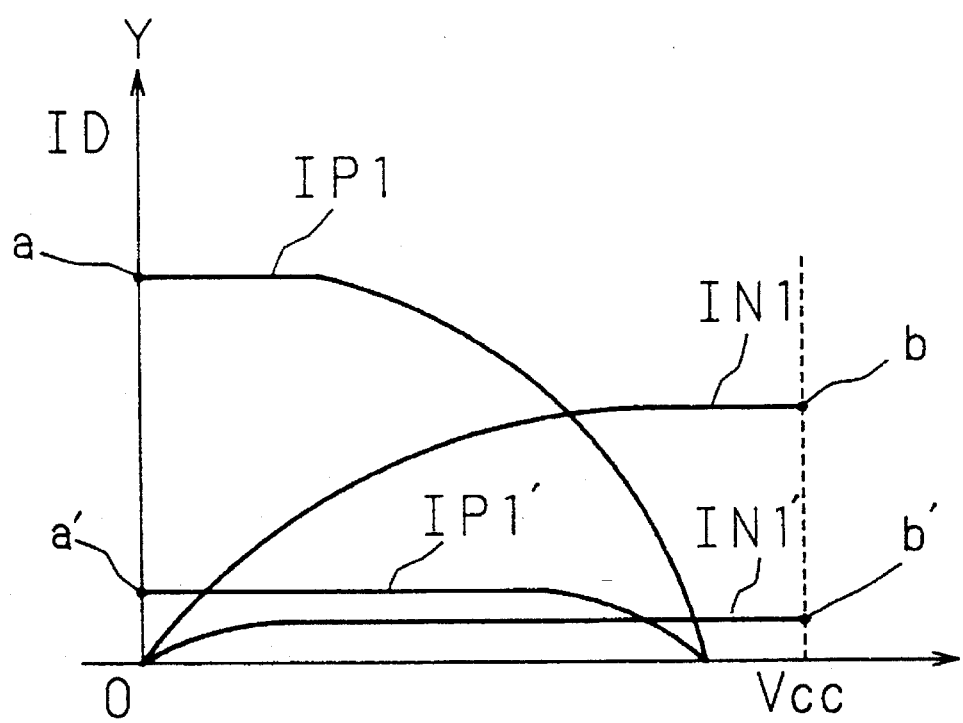
FIG. 11 is a graph explanatory of the principle to obtain two kinds of characteristic of the sense amplifier circuit of the first invention of the microcomputer of the invention.

FIG. 11 is a graph explanatory of the principle to obtain two kinds of characteristics of the sense amplifier circuit 130 shown in FIG. 10.

In FIG. 11, it is assumed that the power voltage Vcc has dropped from 5.0 V to 2.5 V while threshold VTHP and VTHN of the transistor are both 0.7 V, then the value at point a decreases from 9.245 βP1 in case of Vcc=5.0 V down to 1.620 βP1 (point a' in FIG. 11) in case of Vcc=2.5 V according to the following equation.

$$I=\frac{1}{2}* [\beta P1\ (Vcc-VTHP)^2]$$

Namely, the load curve of the Pch-Tr P1 shifts from IP1 to IP1'.

This is same for point b of the load curve IN1 of the Nch-Tr N1, which shifts to IN1' while point b lowers to point b'.

Therefore, when the ratio of Pch-Tr P3 to Pch-Tr P1 in the value of β is set to 5.7:1 (9.24:1.620) and the ratio of Nch-Tr N3 to Nch-Tr N1 in the value of β is set to 5.7:1 (9.24:1.620), the ratio of the composite value of β of the Nch-Trs N3 and N1 to β of Nch-Tr N1 only becomes 5.7:1. Thus the sense amplifier circuit 130 shown in FIG. 10 is capable of providing equivalent characteristics even when the characteristics are switched depending on whether the Vcc is 2.5 V or 5.0 V on the basis of the signal KHB and the complementary signal KLB.

Numerical values given above are mere examples and it needs not to say that the invention is not limited to these values.

While overall constitution of an embodiment of the first invention of the microcomputer of the invention and detailed constitution and basic operation of each component of the ROM 20 have been described above, the microcomputer as a whole operates as follows.

As described previously, the monitor memory transistor 115 does not require the preparatory operation for data read-out.

In the monitor sense amplifier circuit 113, normal read-out operation range on the low voltage side of the power voltage Vcc is set narrower than in case of an ordinary sense amplifier circuit, namely the sense amplifier circuit 13. That is, minimum operating power voltage is higher than in case of the ordinary sense amplifier circuit.

Consequently, when the power voltage Vcc lowers to a certain level, from 5.0 V to 2.5 V, for example, during data read-out from the ROM 20 shown in FIG. 7, the monitor sense amplifier circuit 113 reads data of a value "0" different from the expected value of "1" from the monitor memory transistor 115.

When the judging circuit 101 detects this state, even when the sense amplifier circuit 130 is capable of reading operation from the ROM transistor group 11 normally, the judging circuit 101 judges that the power voltage Vcc is near the operation limit and accordingly turns the switching signal KHB which is outputted via the signal line 102 to the sense amplifier circuit 130 from "L" level to "H" level, and the signal KLB from "H" level to "L" level.

As the value of the switching signals which is outputted from the judging circuit 101 to the sense amplifier circuit 130 is inverted, function of the sense amplifier circuit 130 is switched from the sense amplifier circuit portion comprising mainly the Pch-Trs P1, P2 and the Nch-Trs N1, N2 having circuit constants suited for high voltage similar to the conventional circuit to the sense amplifier circuit portion comprising mainly the Pch-Trs P3, P4 and the Nch-Trs N3, N4 having circuit constants suited for low voltage.

Figure 12:
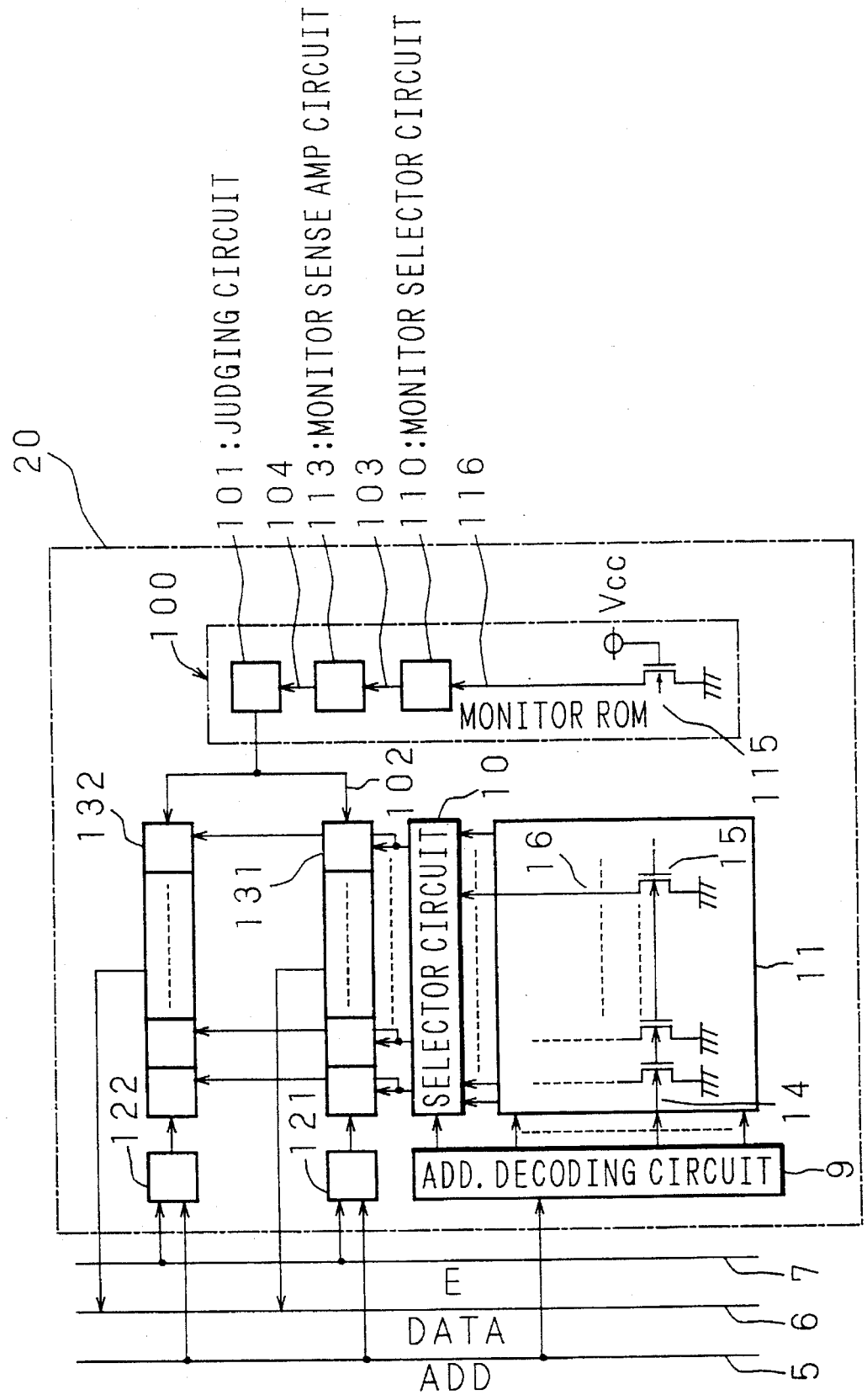
FIG. 12 is a block diagram illustrative of a constitution example of the ROM of another embodiment of the first invention of the microcomputer of the invention.

FIG. 12 is a block diagram illustrative of a constitution example of the ROM in another embodiment of the first embodiment of the microcomputer of the invention, where numerals and symbols identical with those in the embodiment shown in FIG. 7 denote the same or equivalent portions.

In the embodiment, of the first invention shown in FIG. 7 described above, the sense amplifier circuit 130 is made in such a constitution that one of two sense amplifier circuit portions having different characteristics provided in the sense amplifier circuit 130 is selected depending on the switching signals KHB, KLB which are supplied from the outside, and is put into operation. In this embodiment, in contrast, two sense amplifier circuits 131, 132 having different characteristics are provided and either the sense amplifier circuit 131 or 132 is used according to a switching signal which is outputted from the judging circuit 101.

Also sense amplifier control circuits 121, 122 are provided for the sense amplifier circuits 131, 132, respectively.

In another embodiment of the first invention shown in FIG. 12, constitution is similar to the embodiment shown in FIG. 7 except that either the sense amplifier circuit 131 or the sense amplifier circuit 132 is put into operation by switching thereof according to the values of the mutually complementary switching signals KHB, KLB which are outputted via the signal line 102 from the judging circuit 101, and therefore description thereof will be omitted.

Figure 13:
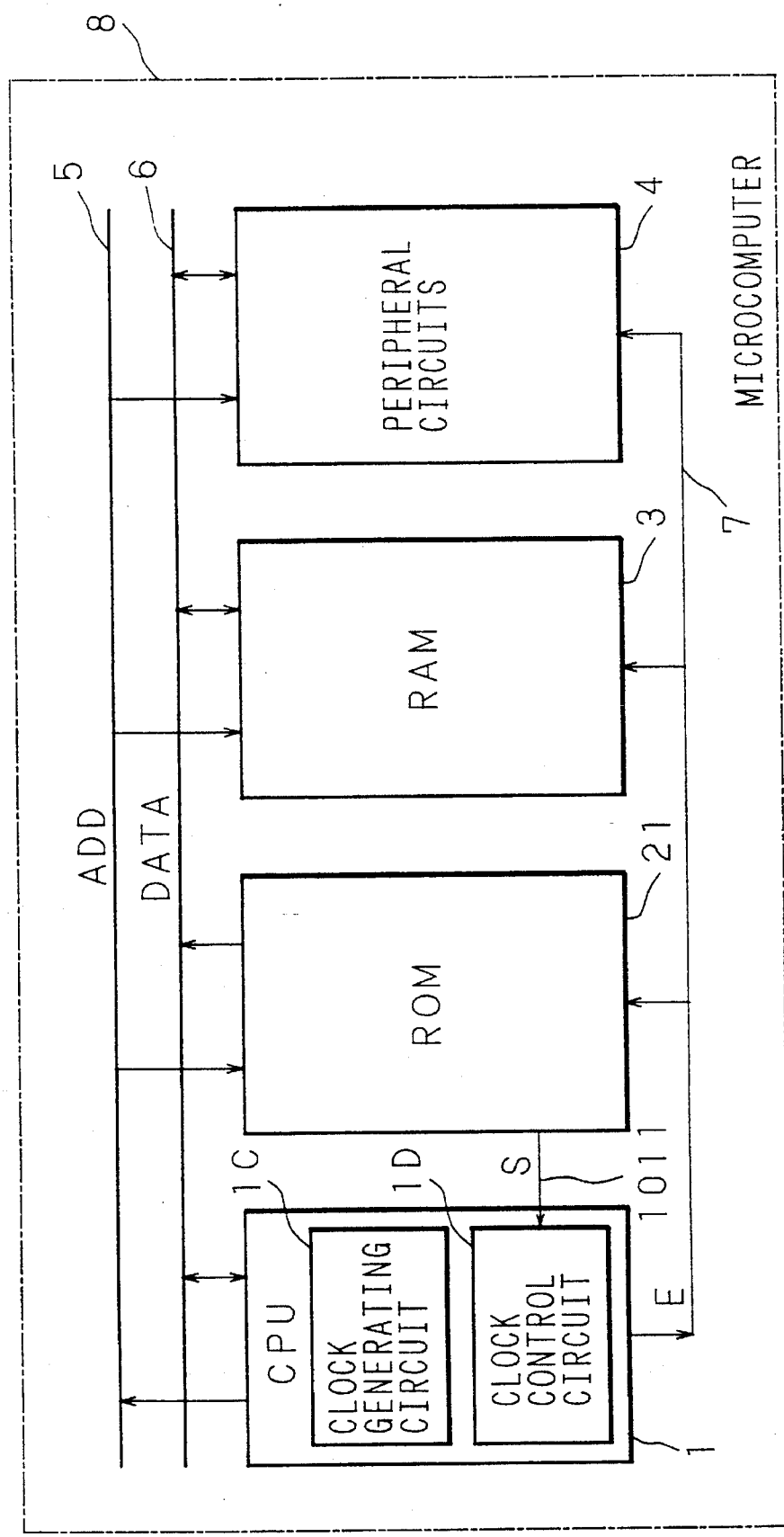
FIG. 13 is a block diagram illustrative of a constitution example of an embodiment of the second invention of the microcomputer of the invention.
Figure 14:
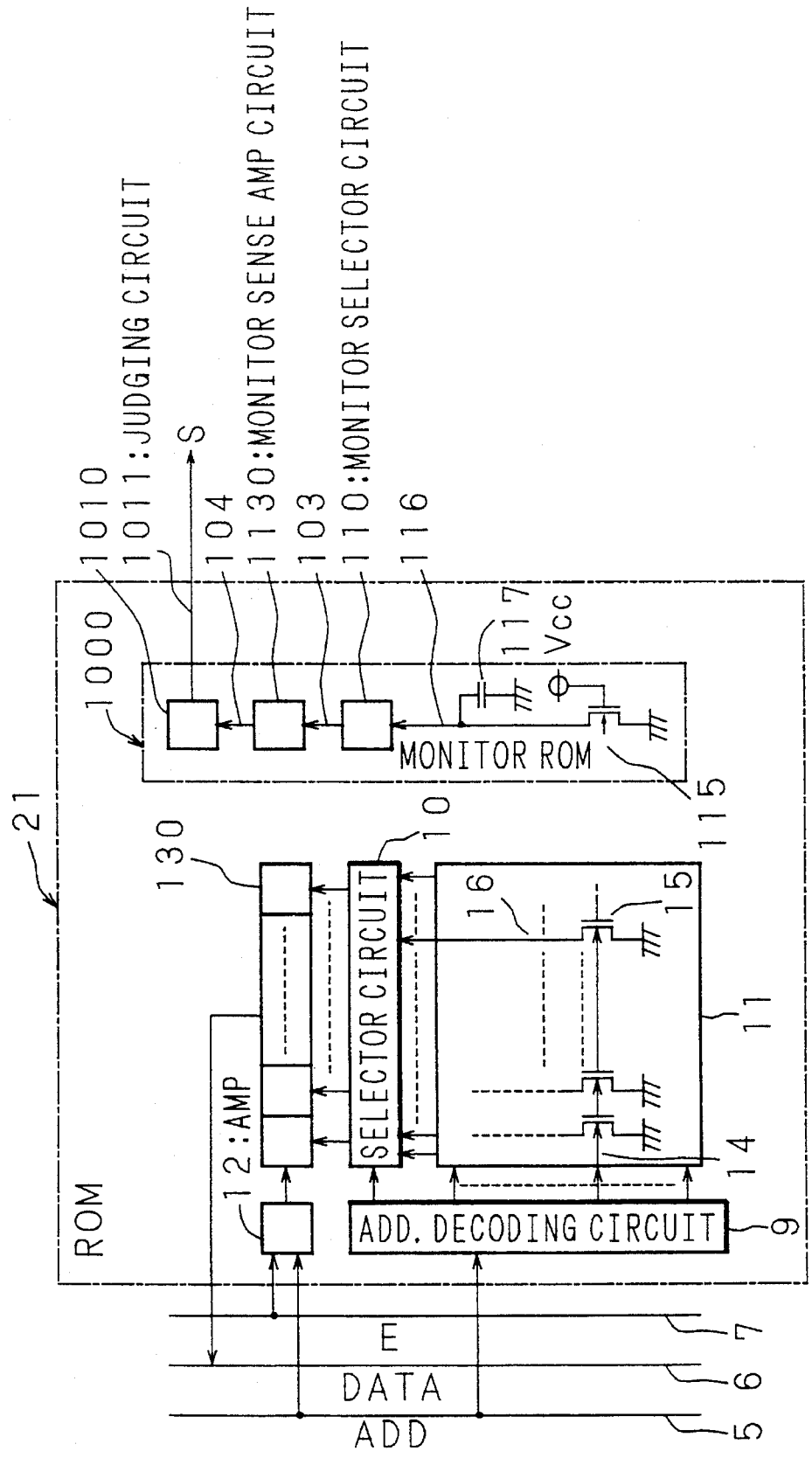
FIG. 14 is a block diagram illustrative of a for the detailed constitution example of the ROM of the second invention of the microcomputer of the invention.

FIG. 13 is a block diagram illustrative of an example of the constitution of one embodiment of the second invention of the microcomputer of the invention. FIG. 14 is a block diagram illustrative of example of the detailed constitution of the ROM.

It needs not to say that the ROM shown in FIG. 14 can be applied to the conventional microcomputer shown in FIG. 1 referred to in the description of the prior art, though it is denoted by numeral 21 as shown in FIG. 13.

In FIG. 13, the constitution is different from that of the conventional microcomputer shown in FIG. 1 and the microcomputer of the first invention shown in FIG. 6 in portions other than the ROM 21, in that the CPU 1 is provided with a clock control circuit 1D in addition to the clock generating circuit 1C.

In FIG. 14, numerals and symbols identical with those in FIG. 2 referred to in the description of the prior art and in FIG. 7 referred to in the description of the first invention denote the same or equivalent components.

Numeral 1000 in FIG. 14 denotes a monitor ROM which characterizes the second invention of the microcomputer of the invention.

The second invention differs from the first invention shown in FIG. 7 in that the sense amplifier circuit 13 similar to the prior art is used in the ROM 21 of the second invention instead of the sense amplifier circuit 130 used in the first invention. Also in the monitor ROM 1000, the second invention differs from the first invention in that a capacitance C denoted by numeral 117 is connected to the monitor bit line 116 which connects the monitor memory transistor 115 and the monitor selector circuit 110 to each other, and a monitor sense amplifier circuit denoted by numeral 1130 has characteristic similar to those of the primary sense amplifier circuit 13 in the second invention, and also in that the judging circuit denoted by numeral 101 in the first invention is denoted by numeral 1010 and has a little different constitution and function in the second invention.

The capacitance 117 is set to be a little larger than the load capacitance of the bit line 16 provided in the ROM transistor group 11. This is for the purpose of making the period t3 shown in the timing chart of FIG. 3 longer when reading signals from the monitor memory transistor 115 by means of the monitor bit line 116 than in case of reading the signal from the memory transistor 15 of the ROM transistor group 11 by means of the bit line 16.

Figure 15:
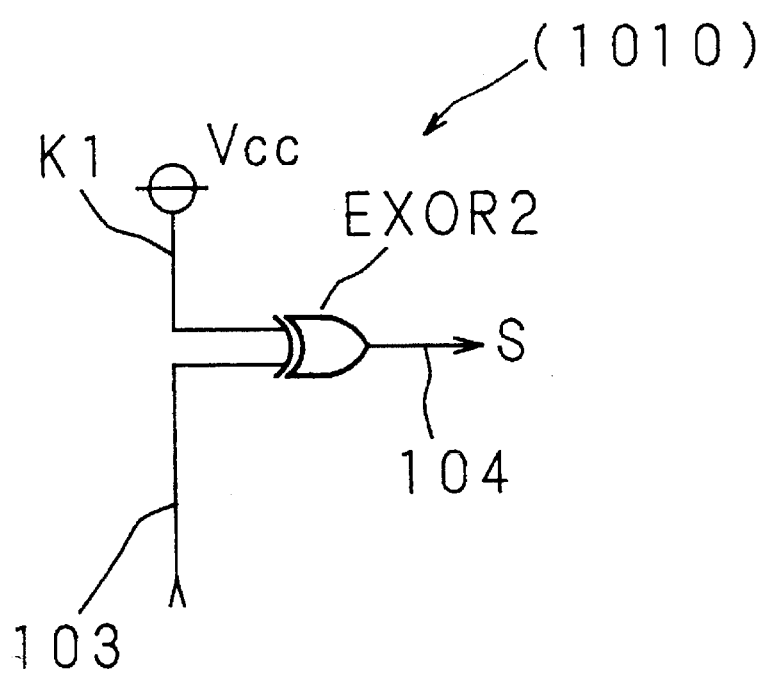
FIG. 15 is a circuit diagram illustrative of the constitution of a judging circuit of the second invention of the microcomputer of the invention.

The judging circuit 1010 of the second invention shown in FIG. 14 is constituted as shown in the circuit diagram of FIG. 15, with an output signal S thereof being sent to the clock control circuit 1D of the CPU 1 shown in FIG. 13 via a signal line 1011.

In FIG. 15, a 2-input exclusive OR gate EXOR2 receives an output signal from the monitor selector circuit 110 via the signal line 103 and a signal of expected value K1 (power voltage Vcc equivalent to "1" in this case) from the monitor memory transistor 115 as inputs. The exclusive OR gate EXOR2 delivers the output signal S at "H" level only when the values of inputs to both input terminals are different from each other.

In the second invention of the microcomputer shown in FIG. 14, when the operating frequency of the microcomputer increases beyond a certain frequency, the sense amplifier circuit 130 of the monitor ROM 1000 reads a value different from the expected value K1 ("1") from the memory transistor 115.

Figure 3:
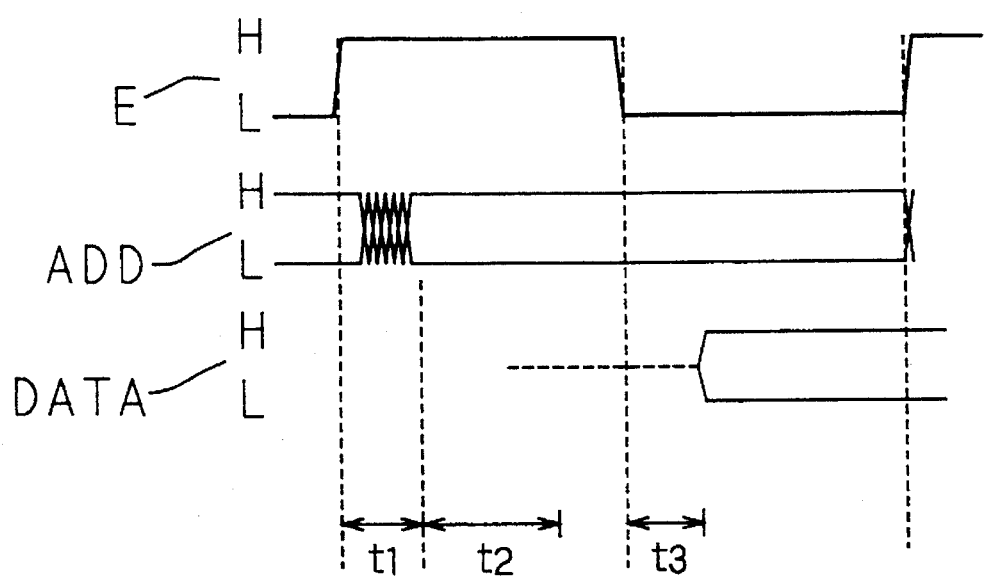
FIG. 3 is a timing chart explanatory of the operation including the progress with time when the conventional ROM of the microcomputer outputs data.

When the judging circuit 1010 detects this state, even when the sense amplifier circuit 13 is capable of reading operation from the ROM transistor group 11 normally, the judging circuit 1010 judges that the limit of read-out operation margin is nearly reached, namely it is determined that the length of the period when the system clock is at "L" level indicated by symbol E in the timing chart of FIG. 3 is near that of the period t3, and accordingly the signal S is sent to the clock control circuit 1D of the CPU 1 shown in FIG. 13.

The clock control circuit 1D temporarily elongates the clock cycle of the system clock generated by the clock generating circuit 1C upon receipt of the signal S, or in another word, decreases the system clock frequency so as to make the period when the system clock is at "L" level indicated by symbol E in the timing chart of FIG. 3 sufficiently longer than the period t3.

Alteration of the system clock frequency in the clock control circuit 1D as described above can be achieved satisfactorily with the prior art, and therefore detailed description thereof will be omitted here.

Figure 16:
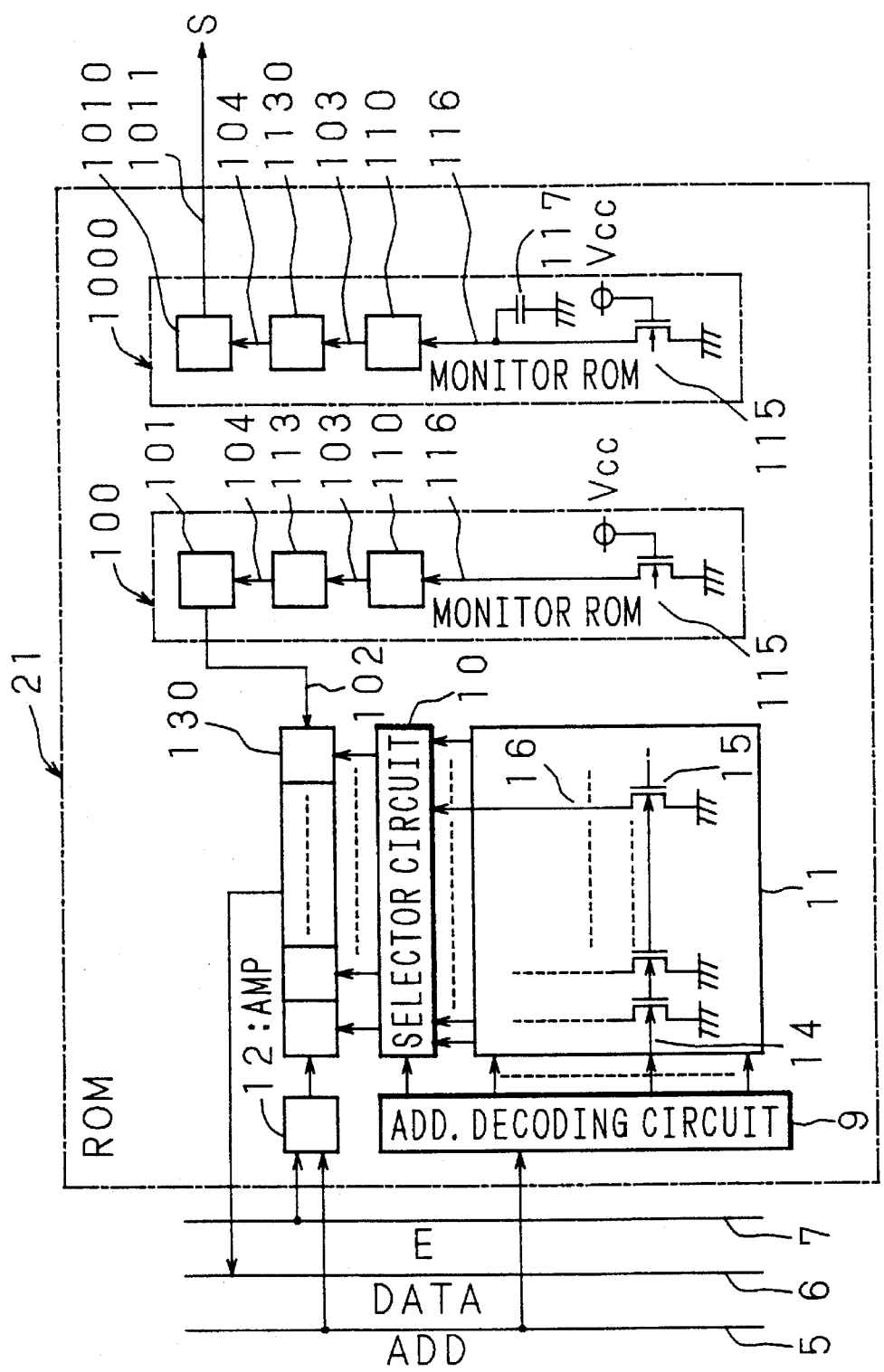
FIG. 16 is a block diagram illustrative of a constitution example of the ROM of the third invention of the microcomputer of the invention.

FIG. 16 is a block diagram illustrative of a constitution example of the ROM in an embodiment of the third invention.

It needs not to say that the ROM shown in FIG. 16 can be applied to the conventional microcomputer shown in FIG. 1 referred to in the description of the prior art, though it will be denoted by numeral 21 as shown in FIG. 13.

In FIG. 16, numerals and symbols identical with those used in FIG. 2 referred to in the description of the prior art and in FIG. 7 referred to in the description of the first invention and in FIG. 14 referred to in the description of the second invention denote the same or equivalent components.

In the third invention, the ROM 21 combines the constitution of the first invention shown in FIG. 7 and the constitution of the second invention shown in FIG. 14 of the microcomputer of the invention. In another word, the ROM 21 is provided with both the monitor ROM 100 of the microcomputer of the first invention shown in FIG. 7 and the ROM 1000 of the microcomputer of the second invention shown in FIG. 14.

Consequently, in the microcomputer of the third invention, when the judging circuit 101 determines that the power voltage is near the operation limit, circuit constant of the sense amplifier circuit 130 is switched by turning the switching signal KHB which is outputted via the signal line 102 to the sense amplifier circuit 130 from "L" level to "H" level and the KLB from "H" level to "L" level and, when the judging circuit, 1010 determines that the read-put margin limit is nearly reached, the signal S is sent to the clock control circuit 1D of the CPU 1 via the signal line 1011 thereby to decrease the system clock frequency.

Although the embodiment of the third invention shown in FIG. 16 has such a constitution as combines the constitution shown in FIG. 7 and the constitution shown in FIG. 14 with each other, it is also possible to adopt a constitution which combines the constitution shown in FIG. 12 and the constitution shown in FIG. 14 with each other.

Although the descriptions of the embodiments described above deal with ROM as an example of memory, it needs not to say that the invention can be basically applied also to RAM.

As described above in detail, according to the first invention of the microcomputer of the invention, when the power voltage decreases so that the limit of the data readout operation from the memory is nearly reached, it is detected in advance to switch the characteristic of the sense amplifier circuit and extend the normal operation range thereof thereby to prevent reading of erroneous data.

Also according to the second invention, when the system clock frequency increases to such an extent that the limit of the margin of data read-out operation from the memory is nearly reached, it is detected in advance thereby to decrease the system clock frequency so that the margin of data read-out operation is secured thereby to prevent reading of erroneous data.

Further according to the third invention, when the power voltage decreases so that the limit of the data read-out operation from the memory is nearly reached, it is detected in advance to switch the characteristic of the sense amplifier circuit and expand the normal operation range thereof thereby to prevent read-out of erroneous data and, when the system clock frequency increases to such an extent that the limit of the margin of data reading operation from the memory is nearly reached, it is detected in advance to decrease the system clock frequency so that the margin of data readout operation is secured thereby to prevent reading of erroneous data.

Thus according to this invention, in addition to that the microcomputer is capable of coping with a fluctuation in the power voltage and a fluctuation in the system clock frequency, design of one kind of sense amplifier circuit is capable of coping with microcomputers which operate on different power voltages or different system clock frequencies in the stage of designing microcomputers.

As this invention may be embodied in several forms without departing from the spirit of essential characteristics thereof, the present embodiment is therefore illustrative and not restrictive, since the scope of the invention is defined by the appended claims, and all changes that fall within meets and bounds of the claims, or equivalence of such meets and bounds thereof are therefore intended to be embraced by the claims.

What is claimed is:

1. A microcomputer, comprising:
   a central processing unit (1) having a clock generating circuit (1C) which generates clock signal (E) serving as the reference of the operation; and
   a memory (20), having:
      an address decoding circuit (9) whereto a plurality of word lines (14) are connected, and which selects one word line (14) when an address signal (ADD) is given from said central processing unit (1);
      a selector circuit, (10) whereto a plurality of bit lines (16) are connected, and which selects at least one bit line (16) when the address signal (ADD) is given from said central processing unit (1);
      a memory transistor group (11) comprising memory transistors (15) each connected at each of the intersections of said plurality of word lines (14) and said plurality of bit lines (16); and
      a sense amplifier circuit (130) which outputs data signal of "1" or "0" according to a signal read from said memory transistor (15) connected at the intersection of one word line (14) selected by said address decoding circuit (9) and one bit line (16) selected by said selector circuit (10) in synchronization with said clock (E);
   further comprising:
   a monitor memory (100), having:
      a monitor memory transistor (115) having characteristic substantially identical with those of said memory transistors (15) and having a specified signal stored in advance as an expected value;
      a monitor selector circuit (110) which always specifies said monitor transistor (115) regardless of the address signal (ADD);
      a monitor sense amplifier circuit (113) whose normal operation range for the power voltage is set narrower than that of said sense amplifier circuit. (130), and which outputs data signal of "1" or "0" according to a signal read from said monitor memory transistor (115) always selected by said monitor selector circuit (110) in synchronization with said clock (E); and
      a judging circuit (101) which judges the data signal outputted from said monitor sense amplifier circuit (113) whether it is true or false with reference to the expected value;
   wherein said sense amplifier circuit (130) comprises a plurality of sense amplifier circuit portions each having an optimum characteristic for different power voltages from the other;
   said monitor sense amplifier circuit (113) reads a signal from said monitor memory transistor (115) in the same period as, or in a period immediately before, a period of said clock (E) during which said central processing unit (1) reads data from said memory transistor group (11); and
   said judging circuit (101) switches from the sense amplifier portion being under operation to another sense amplifier circuit, portion having optimum characteristic in said sense amplifier circuit (130), when the data signal outputted from said monitor sense amplifier circuit (113) is judging to be false.

2. A microcomputer as set forth in claim 1, wherein said plurality of sense amplifier circuit portions of said sense amplifier circuit (130) are constituted in the same sense amplifier circuit.

3. A microcomputer as set forth in claim 1, wherein said plurality of sense amplifier circuit portions of said sense amplifier circuit (130) are constituted as different sense amplifier circuits.

4. A microcomputer, comprising:
   a central processing unit (1) having a clock generating circuit (1C) which generates clock signal (E) serving as the base of the operation; and
   a memory (21), having:
      an address decoding circuit (9) whereto a plurality of word lines (14) are connected, and which selects one word line (14) when an address signal (ADD) is given from said central processing unit (1);
      a selector circuit (10) whereto a plurality of bit lines (16) are connected, and which selects at least one bit line (16) when the address signal (ADD) is given from said central processing unit (1);
      a memory transistor group (11) comprising memory transistors (15) each connected at each of the intersections of said plurality of word lines (14) and said plurality of bit lines (16); and
      a sense amplifier circuit (130) which outputs data signal of "1" or "0" according to a signal read from said memory transistor (15) connected at the intersection of one word line (14) selected by said address decoding circuit (9) and one bit line (16) selected by said selector circuit (10) in synchronization with said clock (E);
   further comprising:
   a monitor memory (1000), having:
      a monitor memory transistor (115) having characteristic substantially identical with those of said memory transistors (15) and having a specified signal stored in advance as an expected value;
      a monitor selector circuit (110) which always specifies said monitor transistor (115) regardless of the address signal (ADD);
      a monitor sense amplifier circuit (1130) which has substantially identical characteristic as said sense amplifier circuit (130), and which outputs data signal of "1" or "0" according to a signal read from said monitor memory transistor (115) always selected by said monitor selector circuit, (110) in synchronization with said clock (E);
      a load capacitance (117) connected to a portion between said monitor memory transistor (115) and said monitor selector circuit (110) so that the rate of reading data of said monitor sense amplifier circuit (1130) from said monitor memory transistor (115) is lower than that of said sense amplifier circuit (130) from said memory transistor (15); and
      a judging circuit (1010) which judges the data signal outputted from said monitor sense amplifier circuit (1130) whether it is true or false with reference to the expected value; and
   a clock control circuit (1D) which changes the frequency of said clock (E) generated by said clock generating circuit (1C);
   wherein said monitor sense amplifier circuit (1130) reads a signal from said monitor memory transistor (115) in the same period as, or in a period immediately before, a period of said clock (E) during which said central processing unit (1) reads data from said memory transistor group (11); and
   said judging circuit (1010) controls said clock control circuit (1D) to lower the frequency of said clock (E) generated by said clock generating circuit (1C), when the data signal outputted from said monitor sense amplifier circuit (1130) is judging to be false.

5. A microcomputer, comprising:

a central processing unit (1) having a clock generating circuit (1C) which generates clock signal (E) serving as the base of the operation; and a memory (21), having:
- an address decoding circuit (9) whereto a plurality of word lines (14) are connected, and which selects one word line (14) when an address signal (ADD) is given from said central processing unit (1);
- a selector circuit (10) whereto a plurality of bit lines (16) are connected, and which selects at least one bit line (16) when the address signal (ADD) is given from said central processing unit (1);
- memory transistor group (11) comprising memory transistors (15) each connected at each of the intersections of said plurality of word lines (14) and said plurality of bit lines (16); and
- a sense amplifier circuit (130) which outputs data signal of "1" or "0" according to a signal read from said memory transistor (15) connected at the intersection of one word line (14) selected by said address decoding circuit (9) and one bit line (16) selected by said selector circuit (10) in synchronization with said clock (E);

further comprising:

a first monitor memory (100), having:
- a monitor memory transistor (115) having characteristic substantially identical with those of said memory transistors (15) and having a specified signal stored in advance as an expected value;
- a monitor selector circuit (110) which always specifies said monitor transistor (115) regardless of the address signal (ADD);
- a monitor sense amplifier circuit (113) whose normal operation range for the power voltage is set narrower than that of said sense amplifier circuit (130), and which outputs data signal of "1" or "0" according to a signal read from said monitor memory transistor (115) always selected by said monitor selector circuit. (110) in synchronization with said clock (E); and
- a judging circuit (101) which judges the data signal outputted from said monitor sense amplifier circuit (113) whether it is true or false with reference to the expected value;

a second monitor memory (1000), having:
- a monitor memory transistor (115) having characteristic substantially identical with those of said memory transistors (15) and having a specified signal stored in advance as an expected value;
- a monitor selector circuit (110) which always specifies said monitor transistor (115) regardless of the address signal (ADD);
- a monitor sense amplifier circuit (1130) which has substantially identical characteristic as said sense amplifier circuit (130), and which outputs data signal of "1" or "0" according to a signal read from said monitor memory transistor (115) always selected by said monitor selector circuit (110) in synchronization with said clock (E);
- a load capacitance (117) connected to a portion between said monitor memory transistor (115) and said monitor selector circuit (110) so that the rate of reading data of said monitor sense amplifier circuit (1130) from said monitor memory transistor (115) is lower than that of said sense amplifier circuit (130) from said memory transistor (15); and
- a judging circuit (1010) which judges the data signal outputted from said monitor sense amplifier circuit (1130) whether it is true or false with reference to the expected value; and a clock control circuit (1D) which changes the frequency of said clock (E) generated by said clock generating circuit (1C);

wherein said sense amplifier circuit (130) comprises a plurality of sense amplifier circuit portions each having an optimum characteristic for different power voltages from the other;

said monitor sense amplifier circuit (113) of said first monitor memory (10) reads a signal from said monitor memory transistor (115) in the same period as, or in a period immediately before, a period of said clock (E) during which said central processing unit (1) reads data from said memory transistor group (11);

said judging circuit (101) of said first monitor memory (100) switches from the sense amplifier port, ion being under operation to another sense amplifier circuit portion having optimum characteristic in said sense amplifier circuit (130), when the data signal outputted from said monitor sense amplifier circuit (113) of said first monitor memory (100) is judging to be false, said monitor sense amplifier circuit (1130) of said second monitor memory (1000) reads a signal from said monitor memory transistor (115) of said second monitor memory (1000) in the same period as, or in a period immediately before, a period of said clock (E) during which said central processing unit (1) reads data from said memory transistor group (11); and said judging circuit (1010) of said second monitor memory (1000) controls said clock control circuit (1D) to lower the frequency of said clock (E) generated by said clock generating circuit (1C), when the data signal outputted from said monitor sense amplifier circuit (1130) of said second monitor memory (1000) is judging to be false.

6. A microcomputer as set forth in claim 5, wherein said plurality of sense amplifier circuit portions of said sense amplifier circuit (130) are constituted in the same sense amplifier circuit.

7. A microcomputer as set forth in claim 5, wherein said plurality of sense amplifier circuit portions of said sense amplifier circuit (130) are constituted as different sense amplifier circuits.

* * * * *